(12) United States Patent
Jo

(10) Patent No.: US 10,788,182 B2
(45) Date of Patent: Sep. 29, 2020

(54) VEHICLE LAMP USING SEMICONDUCTOR LIGHT EMITTING DEVICE AND METHOD FOR CONTROLLING THE SAME

(71) Applicant: ZKW Group GmbH, Wieselburg (AT)

(72) Inventor: Juung Jo, Seoul (KR)

(73) Assignee: ZKW Group GmbH, Wieselburg (AT)

( * ) Notice: Subject to any disclaimer, the term of this patent is extended or adjusted under 35 U.S.C. 154(b) by 0 days.

(21) Appl. No.: 16/235,849

(22) Filed: Dec. 28, 2018

(65) Prior Publication Data

US 2019/0203896 A1 Jul. 4, 2019

(30) Foreign Application Priority Data

Dec. 29, 2017 (KR) .................. 10-2017-0184673

(51) Int. Cl.
| | |
|---|---|
| *F21S 41/153* | (2018.01) |
| *H01L 25/075* | (2006.01) |
| *H01L 33/60* | (2010.01) |
| *B60Q 1/04* | (2006.01) |
| *G02B 27/28* | (2006.01) |
| *H01L 33/62* | (2010.01) |
| *F21S 41/63* | (2018.01) |

(Continued)

(52) U.S. Cl.
CPC .............. *F21S 41/153* (2018.01); *B60Q 1/04* (2013.01); *G02B 27/283* (2013.01); *H01L 25/0753* (2013.01); *H01L 25/0756* (2013.01); *H01L 33/60* (2013.01); *B60Q 2400/20* (2013.01); *F21S 41/135* (2018.01); *F21S 41/635* (2018.01); *H01L 33/62* (2013.01); *H05B 45/10* (2020.01)

(58) Field of Classification Search
CPC ............. H01L 25/0753; H01L 25/0756; H01L 27/153; H01L 27/156
See application file for complete search history.

(56) References Cited

U.S. PATENT DOCUMENTS

| | | | |
|---|---|---|---|
| 7,994,524 B1 * | 8/2011 | Chung ................ | H01L 27/156 257/100 |
| 10,559,557 B2 * | 2/2020 | Chang ................ | H01L 25/0756 |

(Continued)

FOREIGN PATENT DOCUMENTS

| | | |
|---|---|---|
| EP | 2355151 | 8/2011 |
| EP | 3021039 | 5/2016 |

(Continued)

OTHER PUBLICATIONS

Partial European Search Report in European Application No. 18213456.9, dated May 7, 2019, 12 pages.

*Primary Examiner* — Mariceli Santiago
(74) *Attorney, Agent, or Firm* — Fish & Richardson P.C.

(57) ABSTRACT

A vehicle lamp includes a plurality of light emitting modules that are vertically stacked with each other in a thickness direction, each of the light emitting modules including a substrate and a plurality of semiconductor light emitting devices located on the substrate, and partition walls located between the semiconductor light emitting devices, the partition walls passing through each of the light emitting modules in the thickness direction. The semiconductor light emitting devices provided in different light emitting modules among the light emitting modules are configured to emit light having different wavelengths.

19 Claims, 8 Drawing Sheets

(51) Int. Cl.
*F21S 41/135* (2018.01)
*H05B 45/10* (2020.01)

(56) References Cited

U.S. PATENT DOCUMENTS

| | | | |
|---|---|---|---|
| 2011/0101383 A1* | 5/2011 | Hermann | H01L 25/0756 |
| | | | 257/88 |
| 2013/0329440 A1* | 12/2013 | Tsutsumi | F21S 41/176 |
| | | | 362/465 |
| 2014/0367708 A1 | 12/2014 | Sorg et al. | |
| 2015/0171140 A1* | 6/2015 | Sugizaki | H01L 33/504 |
| | | | 257/89 |
| 2015/0357315 A1 | 12/2015 | Oraw | |
| 2016/0163940 A1 | 6/2016 | Huang et al. | |
| 2017/0288093 A1 | 10/2017 | Cha et al. | |
| 2017/0309608 A1* | 10/2017 | Kumar | H01L 21/76802 |

FOREIGN PATENT DOCUMENTS

| | | |
|---|---|---|
| JP | 2011159671 | 8/2011 |
| JP | 2017212210 | 11/2017 |
| KR | 100849826 | 7/2008 |
| WO | WO2018175338 | 9/2018 |

* cited by examiner

VEHICLE LAMP USING SEMICONDUCTOR LIGHT EMITTING DEVICE AND METHOD FOR CONTROLLING THE SAME

CROSS-REFERENCE TO RELATED APPLICATION

Pursuant to 35 U.S.C. § 119(a), this application claims the benefit of earlier filing date and right of priority to Korean Application No. 10-2017-0184673, filed on Dec. 29, 2017, the contents of which are incorporated by reference herein in its entirety.

FIELD

The present disclosure relates to a vehicle lamp and a method for controlling the same, and in particular to a vehicle lamp using a semiconductor light emitting device.

BACKGROUND

A vehicle may be equipped with a variety of vehicle lamps having a lighting function or a signal function. For example, a vehicle may include a halogen lamp or a gas discharge lamp. Recently, a light emitting diode (LED) is of interest as a light source of the vehicle lamp.

The light emitting diode (LED) may be minimized in size to increase a degree of design freedom of the lamp and to achieve economical efficiency by virtue of a semi-permanent lifetime. In some cases, the LED may be manufactured in a package type. The light emitting diode (LED) itself without a package may be a semiconductor light emitting device that can convert current into light and that can be used as a light source for displaying images at an electronic device including information communication equipment.

In some cases, the vehicle lamp including a package type light emitting diode may have a low manufacturing yield, which causes high cost and a low degree of flexibility.

In some cases, the vehicle lamp may include, to implement an intelligent lamp, a structure for selectively lighting a portion of the lamp. In some cases, it is of interest to reduce interference between light beams emitted from a plurality of light emitting devices included in the lamp.

SUMMARY

One object of the present disclosure is to provide a vehicle lamp having a structure in which semiconductor light emitting devices are vertically stacked.

Another object of the present disclosure is to provide a structure capable of selectively lighting or flickering only some of the light emitting regions of a vehicle lamp.

A further object of the present disclosure is to provide a structure configured such that various colors of light can be emitted from a single lamp and a method for controlling the same.

A still further object of the present disclosure is to provide a structure configured such that light beams emitted from a single lamp can be directed toward the front of a vehicle and a road surface around the vehicle, respectively.

According to one aspect of the subject matter described in this application, a vehicle lamp includes a plurality of light emitting modules that are vertically stacked with each other in a thickness direction, each of the light emitting modules comprising a substrate and a plurality of semiconductor light emitting devices located on the substrate, and partition walls located between the semiconductor light emitting devices, the partition walls passing through each of the light emitting modules in the thickness direction. The semiconductor light emitting devices provided in different light emitting modules among the light emitting modules are configured to emit light having different wavelengths.

Implementations according to this aspect may include one or more of the following feature. For example, the vehicle lamp may further include a first electrode line and a second electrode line that are electrically connected to each of the plurality of semiconductor light emitting devices, where each of the light emitting modules includes a first electrode configured to connect to the first electrode line and a second electrode configured to connect to the second electrode line. In some examples, the partition walls may define holes that allow the first and second electrode lines to pass and that are located at least one of the plurality of light emitting modules except for a bottommost light emitting module among the plurality of light emitting modules.

In some implementations, a bottommost light emitting module among the plurality of light emitting modules may include portions of the first and second electrode lines that are located vertically below the semiconductor light emitting device of the bottommost light emitting module, where the portions of the first and second electrode lines pass through the substrate of the bottommost light emitting module. In some implementations, each of the light emitting modules may include at least one of the semiconductor light emitting devices located between a first partition wall and a second partition wall among the partition walls, the second partition wall facing the first partition wall.

In some implementations, the light emitting modules may include a first light emitting module and a second light emitting module stacked on the first light emitting module. In some examples, one of the first light emitting module or the second light emitting module includes a semiconductor light emitting device configured to emit red light, and the other of the first light emitting module or the second light emitting module includes a semiconductor light emitting device configured to emit green light and a semiconductor light emitting device configured to emit blue light.

In some implementations, the semiconductor light emitting devices provided in any one of the light emitting modules are configured to emit light having a same wavelength. For example, the light emitting modules may include three light emitting modules stacked with each other, and each of the three light emitting modules includes a semiconductor light emitting device configured to emit any one of red, green, or blue light. In some examples, the semiconductor light emitting device configured to emit red light may be disposed on a bottommost light emitting module among the three light emitting modules.

In some implementations, the semiconductor light emitting devices included in the light emitting modules are offset from each other in a width direction transverse to the thickness direction. In some implementations, each of the partition walls includes a first partition wall part that passes through the light emitting modules and a second partition wall part located between the light emitting modules. In some implementations, the vehicle lamp further includes a transparent adhesive layer disposed between the light emitting modules, where the transparent adhesive layer is disposed between second partition wall parts.

In some implementations, the first partition wall part may overlap with the second partition wall part. In some examples, the second partition wall part may be a mesh-type partition wall part.

In some implementations, the light emitting modules include at least one of the semiconductor light emitting devices that is disposed between a first partition wall and a second partition wall among the partition walls, the second partition wall facing the first partition wall. In such implementations, at least one of the semiconductor light emitting devices may be configured to selectively emit light based on a voltage applied to the at least one of the semiconductor light emitting devices.

In some implementations, the vehicle lamp may further include a polarized beam splitter that is located in a path of light emitted from the light emitting modules, that is configured to separate at least a portion of light beams emitted from the light emitting modules, and that is configured to change proceeding directions of at least the portion of light beams. In some examples, the polarized beam splitter is configured to rotate relative to the light emitting modules. In some implementations, the vehicle lamp may further include an optical filter layer that overlaps with the polarized beam splitter and that is configured to restrict transmission of light having a predetermined wavelength. In some implementations, the vehicle lamp may further include a light mixing layer that is located in a path of light emitted from the light emitting modules and configured to change optical paths of light beams emitted from the light emitting modules.

According to another aspect, described is a method for controlling a vehicle lamp that includes a plurality of pixels, each pixel including semiconductor light emitting devices that emit at least one of red, green, or blue light. The method includes: applying a voltage to each of the semiconductor light emitting devices included in each of the pixels to cause each of the semiconductor light emitting devices to emit at least one of red, green, or blue light to thereby output white light from the vehicle lamp; receiving a request for displaying information on a road surface; in response to reception of the request, interrupting the voltage applied to a first portion of the semiconductor light emitting devices included in one or more of the pixels to thereby output light having a different color than white from one or more of the pixels; and based on interrupt of the voltage applied to the first portion of the semiconductor light emitting devices, increasing an amplitude of the voltage applied to a second portion of the semiconductor light emitting devices that has received the voltage without interrupt to thereby increase an intensity of light output from one or more of the pixels.

In some implementations, it is not necessary to transfer different types of semiconductor light emitting devices to one substrate, which leads to a reduced transfer time.

In some implementations, partition walls may be disposed between the vertically-stacked semiconductor light emitting devices, which increases a contrast effect between the semiconductor light emitting devices. In such implementations, the lamp may selectively light or flicker some of the light emitting regions of the lamp.

In some implementations, light beams from the vertically stacked light emitting devices are mixed and emitted to an outside, which enables implementation of various colors in the single lamp.

In some implementations, proceeding directions of some of the light beams emitted from the light emitting regions can be changed. In some examples, the single lamp may be configured to assist the driver to view the outside and to communicate with pedestrians or other drivers.

DETAILED DESCRIPTION

A vehicle lamp described herein may include, but not be limited to, a headlamp, a tail lamp, a vehicle light, a fog light, a direction indicating lamp, a brake light, an emergency light, a rear lamp, or the like. However, it will be readily apparent to those skilled in the art that the configuration according to the implementations described herein may be applied to a new product to be developed in the future, so far as it has a display function.

Figure 1:
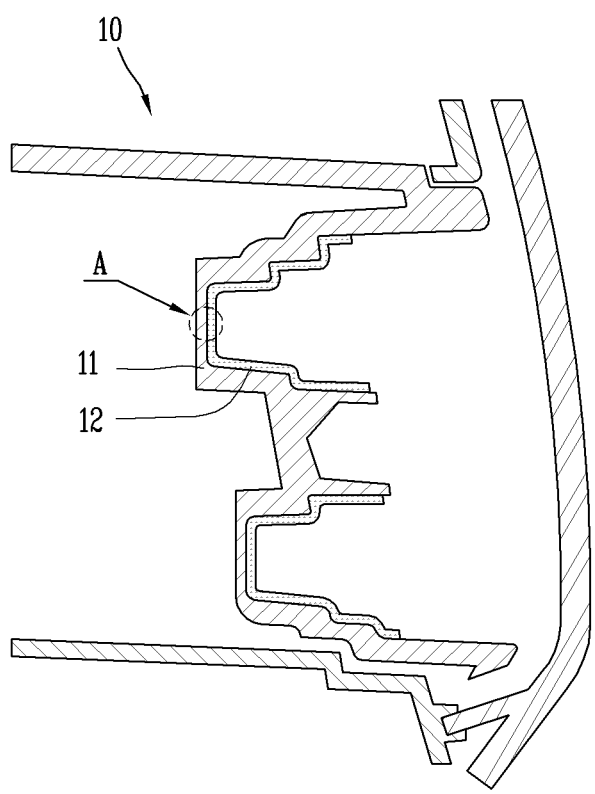
FIG. 1 is a concept view showing an example vehicle lamp using an example semiconductor light emitting device.

FIG. 1 illustrates an example vehicle lamp using a semiconductor light emitting device.

For example, the vehicle lamp 10 may include a frame 11 configured to be coupled to a vehicle body and a light source part 12 configured to be installed on the frame 11.

A wiring line for supplying power to the light source part 12 is connected to the frame 11, and the frame 11 may be fastened to the body directly or via a bracket. As shown, a lens unit may be provided in order for light emitted from the light source part 12 to be more clear and easily diffused.

The light source part 12 may be a flexible light source part that can be bent, curved, twisted, folded, and rolled by an external force.

When the light source part 12 is not bent (for example, when it has an infinite radius of curvature; hereinafter, referred to as a first state), it becomes a plane. When the light source part 12 is bent due to an external force in the first state (for example, when it has a finite radius of curvature; hereinafter, referred to as a second state), the flexible light source part may be at least partially bent or curved.

A pixel of the light source part 12 may be implemented by a semiconductor light emitting device. In the present disclosure, a light emitting diode LED is given as an example of a semiconductor light emitting device that converts current into light. The light emitting diode is formed in a small size and can serve as a pixel in the second state.

In some implementations, the light source part 12 includes a unit light source, a base substrate, and a connecting electrode. These components will be described below in detail.

The light source part 12 may be only composed of the unit light source. The unit light source will be described below in detail through the light source part 12 only composed of the unit light source.

Figure 2:
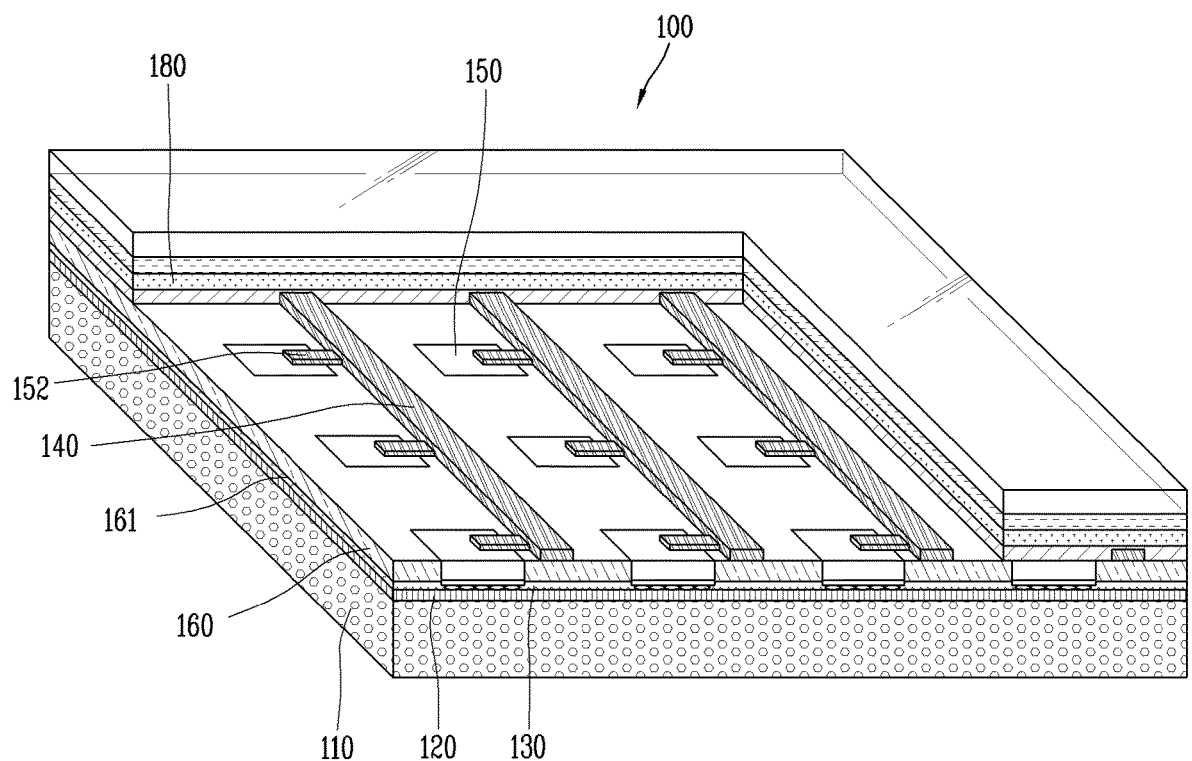
FIG. 2 is a partial enlarged view of the part A of FIG. 1.
Figure 3:
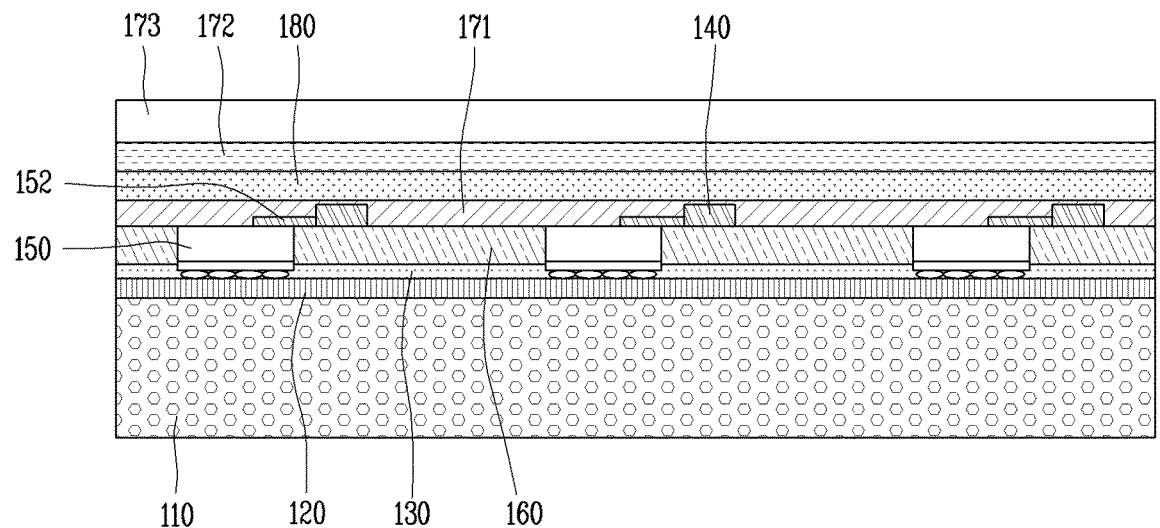
FIG. 3 is a sectional view of the part A of FIG. 1.
Figure 4:
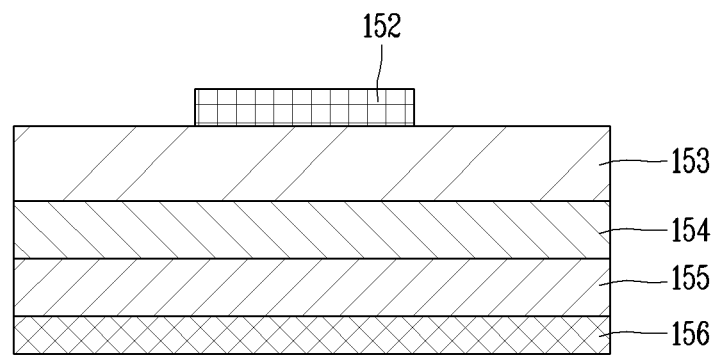
FIG. 4 is a concept view showing an example vertical type semiconductor light emitting device.
Figure 5:
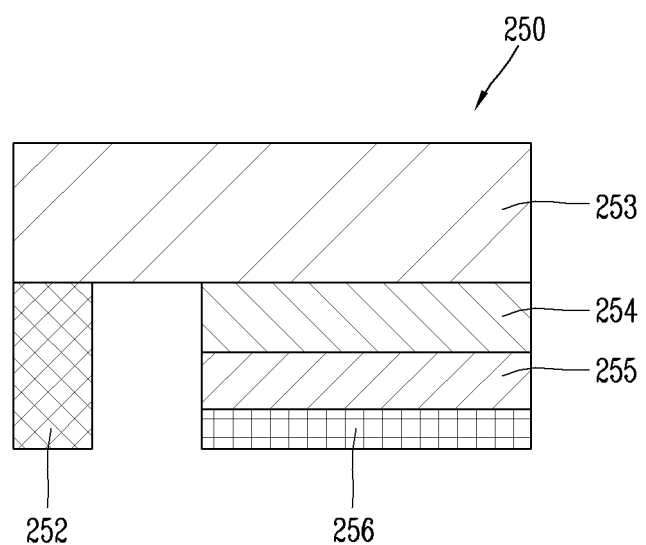
FIG. 5 is a concept view showing an example flip chip type semiconductor light emitting device.

FIG. 2 is a partial enlarged view of part A of FIG. 1, FIG. 3 is a sectional view, FIG. 4 is a concept view showing an example vertical type semiconductor light emitting device, and FIG. 5 is a concept view showing an example flip chip type semiconductor light emitting device.

As shown in FIGS. 2, 3, and 4, a passive matrix (PM) type semiconductor light emitting device is used as a unit light source 100 using a semiconductor light emitting device. However, the following description is also applicable to an active matrix (AM) type semiconductor light emitting device.

The unit light source 100 includes a substrate 110, a first electrode 120, a first adhesive layer 130, a second electrode 140, and a plurality of semiconductor light emitting devices 150.

The substrate 110 is a base layer on which the structure is formed through the whole process and may be a wiring substrate on which the first electrode 120 is disposed. The substrate 110 may include glass or polyimide (PI) to implement a flexible light source part. In addition, the substrate 110 may be made of a thin metal. Any type of insulating and flexible material, e.g., polyethylene naphthalate (PEN) and polyethylene terephthalate (PET) may be used. Furthermore, the substrate 110 may be either transparent or opaque.

In some examples, a heat-radiating sheet or heat sink may be mounted on the substrate 110 to implement a heat-radiating function. In this case, the heat-radiating sheet or heat sink may be mounted on the opposite surface to the surface having the first electrode 120 thereon.

The first electrode 120 may be positioned on the substrate 110 and provided as a planar electrode. Therefore, the first electrode 120 may be an electrode layer disposed on the substrate and can serve as a data electrode. In some implementations, an electrode pad 123 for facilitating an electrical connection to the connecting electrode 220 may be disposed on the first electrode 120.

The first adhesive layer 130 is formed on the substrate 110 having the first electrode 120 thereon.

The first adhesive layer 130 may be a layer with adhesiveness and conductivity. To this end, the first adhesive layer 130 may be made of a mixture of a conductive material and an adhesive material. Accordingly, the first adhesive layer may be referred to as a conductive first adhesive layer. Also, the first adhesive layer 130 has ductility, which makes it possible for the light source part to have a flexible function.

As an example, the first adhesive layer 130 may be an anisotropy conductive film (ACF), an anisotropy conductive paste, a solution containing conductive particles, and the like. The first adhesive layer 130 may be provided as a layer allowing an electrical connection in a vertical Z direction but having an electric insulation in a horizontal X-Y direction. Thus, the first adhesive layer 130 may be called as a Z-axis conductive layer.

The anisotropy conductive film is made of a mixture of an anisotropy conductive medium and an insulating base member, such that, when heat and pressure are applied thereto, only specific portions have conductivity due to the anisotropy conductive medium. In the following description, heat and pressure are applied to the anisotropy conductive film, but different methods can be used to make the anisotropy conductive film partially conductive. For example, this methods may include the application of either heat or pressure or UV curing.

In addition, the anisotropy conductive medium may be a conductive ball or conductive particle, for example. As shown, in this example, the anisotropy conductive film is made of a mixture of a conductive ball and an insulating base member, such that, when heat and pressure are applied thereto, only specific portions have conductivity due to the conductive ball. The anisotropy conductive film may include a plurality of particles in which a conductive core is coated with an insulating film made of a polymer material. In this case, the insulating film of the heat and pressure-applied portion is destroyed and the core provides conductivity. Here, the shape of the core may be modified to form layers contacting each other in the thickness direction of the film. As a more specific example, heat and pressure are applied to the entire anisotropy conductive film, and an electrical connection in the Z-axis direction is partially formed due to a height difference of an object adhered by the anisotropy conductive film.

As another example, the anisotropy conductive film may include a plurality of particles in which an insulating core is coated with a conductive material. In this case, the conductive material of the heat and pressure-applied portion is deformed (stuck) to have conductivity in the thickness direction of the film. As a further example, the conductive material may pass through the insulating base member in the Z-axis direction to have conductivity in the thickness direction of the film. In this case, the conductive material may have a pointed end.

As shown, the anisotropy conductive film may be a fixed array ACF in which a conductive ball is inserted into one surface of the insulating base member. For example, the insulating base member is made of a material with adhesiveness, and the conductive ball is intensively disposed on the bottom of the insulating base member, such that, when heat and pressure are applied to the base member, it is deformed together with the conductive ball to have conductivity in the vertical direction.

However, the present disclosure is not limited thereto, but the anisotropy conductive film may be configured such that the conductive ball is randomly incorporated into the insulating base member or may be composed of a plurality of layers, with the conductive ball disposed on any one of the layers (double-ACF).

The anisotropy conductive paste, which is a combined form of a paste and a conductive ball, may be made of a mixture of an insulating and adhesive base material and a conductive ball. In addition, the solution containing the conductive particles may contain conductive particles or nano particles.

When the first electrode 120 is positioned on the substrate 110, for example, the anisotropy conductive film is positioned thereon, and then heat and pressure are applied thereto to connect the semiconductor light emitting device 150, so that the semiconductor light emitting device 150 is electrically connected to the first electrode 120. Here, the semiconductor light emitting device 150 may be positioned on the first electrode 120. In addition, since the anisotropy conductive film contains adhesive components, the first adhesive layer 130 implements an electrical connection as well as a mechanical connection between the semiconductor light emitting device 150 and the first electrode 120.

As a further example, the first adhesive layer may include Tin alloy, Au, Al, or Pb for eutectic bonding, and the substrate and the semiconductor light emitting device may be coupled to each other by means of the eutectic bonding.

The semiconductor light emitting device 150 has excellent brightness, and thus can compose an individual unit pixel in a small size. Such an individual semiconductor light emitting device 150 may be a rectangular or square device in which one side has a length of 80 µm or less. In this case, the area of the single semiconductor light emitting device 150 may range from $10^{-10}$ to $10^{-5}$ m$^2$ and the distance between the light emitting devices may range from 100 μm to 10 mm.

The semiconductor light emitting device 150 may have a vertical type structure.

A plurality of second electrodes 140 are positioned between the vertical type semiconductor light emitting devices and electrically connected thereto.

Referring to FIG. 4, this vertical type semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned at the lower portion can be electrically connected to the first electrode 120 by the first adhesive layer 130, and the n-type electrode 152 positioned at the upper portion can be electrically connected to the second electrode 140 discussed later. This vertical type semiconductor light emitting device has a significant advantage of reducing a chip size since the electrodes can be placed up and down.

Referring to FIGS. 2 and 3 again, the plurality of semiconductor light emitting devices 150 compose a light emitting device array, and an insulation layer 160 is formed between the plurality of semiconductor light emitting devices 150. For example, the insulation layer 160 is formed on one surface of the first adhesive layer 130 to fill the spaces between the semiconductor light emitting devices 150.

However, the present disclosure is not limited thereto, and the first adhesive layer 130 may fill the spaces between the semiconductor light emitting devices without the insulation layer 160.

The insulation layer 160 may be a transparent insulation layer including SiOx. As another example, polymer materials having excellent insulation and low optical absorption, such as epoxy, methyl and phenyl-based silicon, or inorganic materials such as SiN and Al$_2$O$_3$ may be used for the insulation layer 160 as a structure for preventing shorts between the electrodes.

As shown, a phosphor layer 180 is formed on the light emitting device array.

The phosphor layer 180 may be formed on one surface of the semiconductor light emitting device 150. For example, the semiconductor light emitting device 150 may be a blue semiconductor light emitting device 151 emitting blue light B, and a phosphor layer 180 may be provided to convert this blue light B into a different color of light. In this case, the phosphor layer 180 may have a red phosphor capable of converting the blue light B into red light R, a green phosphor capable of converting the blue light B into green light G, or a yellow phosphor capable of converting the blue light B into white light W.

In this case, the wavelength of light generated in the nitride-based semiconductor light emitting device ranges from 390 to 550 nm, which can be converted into 450 to 670 nm through the phosphor-inserted film. In addition, both the red phosphor and the green phosphor may be provided to mix various wavelength of light to implement the white light. In some examples, when red light is required, in the case of a GaAs-based red semiconductor light emitting device, not a phosphor but a light diffusion film may be used. Further, a patterned sheet may be inserted to improve optical extraction efficiency.

In this case, an optical gap layer 171 may be present between the semiconductor light emitting device 150 and the phosphor layer 180. The optical gap layer 171 may be formed of a material having low optical absorption and excellent bending property, such as epoxy, acryl, or methyl and phenyl-based silicon. Also, a patterned sheet may be inserted or particles having a different refractive index may be mixed for the optimization of optical efficiency.

In some implementations, a color filter 172 may be stacked on the phosphor layer 180 to improve color purity of the converted light. In addition, in order to protect the light source part from moisture, oxygen and external shock, a protective layer 173 may be formed to cover the color filter 172. Here, the protective layer 173 may be implemented by film bonding or resin coating.

Furthermore, referring to FIG. 5, the semiconductor light emitting device may be a flip chip type light emitting device.

For example, the semiconductor light emitting device includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253 to be spaced apart from the p-type electrode 256. In this case, the p-type electrode 256 can be electrically connected to the first electrode, and the n-type electrode 252 can be electrically connected to the second electrode.

When the semiconductor light emitting devices that emit different colors of light are disposed on the vehicle lamp described above, the single vehicle lamp can implement a variety of colors. For example, when the semiconductor light emitting devices that emit red, green and blue light are disposed on the lamp, respectively, the lamp can implement a variety of colors including a white color.

However, since the semiconductor light emitting devices are very small, it is very difficult to dispose different types of light emitting devices on the same substrate. It leads to an increased manufacturing cost and time of the lamp.

The present disclosure provides a vehicle lamp of a novel structure that is easy to manufacture and capable of implementing a variety of colors. Along with this, the present disclosure provides a vehicle lamp that is capable of lighting or flickering some of the light emitting regions of the lamp.

Hereinafter, the present disclosure will be described in detail with reference to the accompanying drawings.

Figure 6:
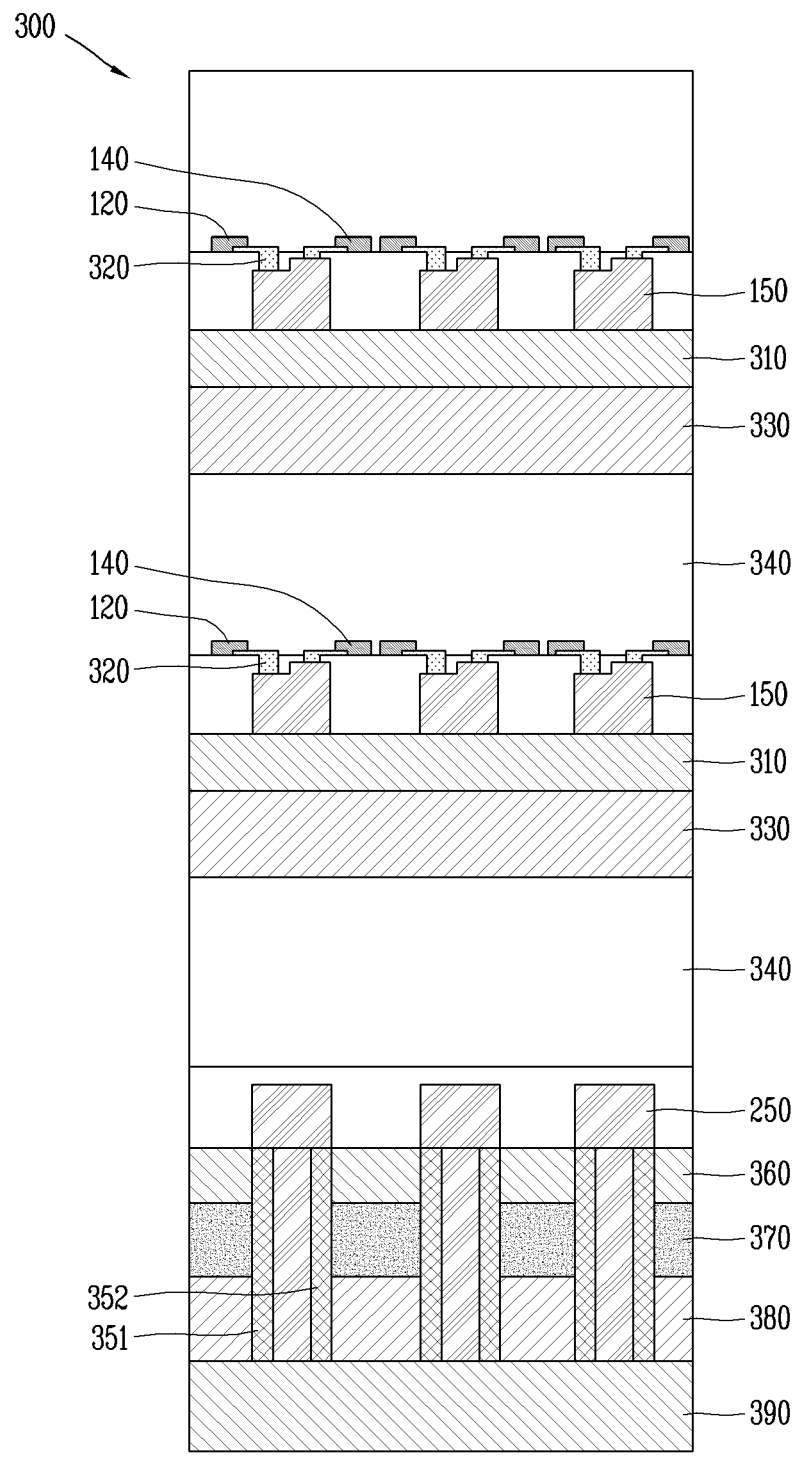
FIG. 6 is a sectional view of an example vehicle lamp.

FIG. 6 is a sectional view of an example vehicle lamp.

In the lamp, a plurality of semiconductor light emitting modules are vertically stacked. The light emitting module may include a substrate, a plurality of semiconductor light emitting devices, and a plurality of electrode lines. Here, the electrode lines and the plurality of semiconductor light emitting devices are electrically connected.

In some implementations, the lamp may include two types of semiconductor light emitting modules.

The first semiconductor light emitting module is disposed at an upper layer part of the lamp. When the plurality of semiconductor light emitting modules are vertically stacked, the substrates provided in the respective semiconductor light emitting modules overlap with each other. Here, the substrates may be made of a light transmitting material so that the semiconductor light emitting module disposed on the relatively upper side does not absorb or reflect light emitted from the semiconductor light emitting module disposed on the relatively lower side.

Referring to FIG. 6, the first semiconductor light emitting module may include a substrate 330, an adhesive layer 310, a plurality of semiconductor light emitting devices 150, and a plurality of electrode lines 120 and 140. The substrate 330 and the adhesive layer 310 may be made of a light transmitting material. The semiconductor light emitting device is attached to the substrate 330 through the transparent adhesive layer 310.

In this specification, the flip chip type semiconductor light emitting device in FIG. 5 has been described as an example of the semiconductor light emitting device provided in the first semiconductor light emitting module, but the first semiconductor light emitting device may include the vertical type semiconductor light emitting device in FIG. 4.

In some implementations, the electrode lines 120 and 140 may be disposed on the upper side of the semiconductor light emitting module. Since the electrode lines 120 and 140 are made of a metal with high electric conductivity, if they overlap with the semiconductor light emitting devices, they may reflect light and reduce an intensity of light of the lamp. In some implementations, the electrode lines 120 and 140 may be electrically connected to the semiconductor light emitting devices 150 through a transparent electrode 320. Therefore, not the electrode lines 120 and 140 but the transparent electrode 320 overlap with the semiconductor light emitting devices 150.

In some examples, the first semiconductor light emitting module may include a light diffusion layer 340 so that light beams emitted from the semiconductor light emitting devices are well mixed and emitted to the outside. For example, the light diffusion layer 340 may be made of a light transmitting polymer material such as Polydimethylsiloxane (PDMS).

Furthermore, the second semiconductor light emitting module is a light emitting module disposed on the bottommost layer of the lamp. For example, the second semiconductor light emitting module is disposed on a base substrate 390. The second semiconductor light emitting module may include a substrate 380, a reflective layer 370, an adhesive layer 360, a plurality of semiconductor light emitting devices 250, and a plurality of electrode lines 351 and 352.

Since a semiconductor light emitting device is not disposed on the lower side of the second semiconductor light emitting module, the substrate 380 is not necessarily made of a transparent material. Moreover, the electrode lines may be disposed on the lower side of the semiconductor light emitting device to prevent light directed toward the upper side of the semiconductor light emitting device from being reflected by the electrode lines.

In some implementations, the second semiconductor light emitting module reflects the light directed toward the lower side of the lamp to be directed toward the upper side of the lamp. To this end, the second semiconductor light emitting device includes the reflective layer 370. The reflective layer may be made of a metal or an inorganic material with high reflectivity.

In some examples, the electrode lines 351 and 352 provided in the second semiconductor light emitting module may be formed to pass through the adhesive layer 360, the reflective layer 370, and the substrate 380. This is intended to minimize holes formed in partition walls discussed later. It will be described below.

Furthermore, the second semiconductor light emitting module may include a light diffusion layer 340 like the first semiconductor light emitting module.

The lamp has a structure in which the second semiconductor light emitting module and the first semiconductor light emitting module are stacked in order or a structure in which one second semiconductor light emitting module and two first semiconductor light emitting modules are stacked in order.

The aforementioned first semiconductor light emitting module may be separately manufactured, and then stacked with another semiconductor light emitting modules in a vertical manner. Here, the respective semiconductor light emitting modules may have semiconductor light emitting devices that emit different wavelengths of light. As such, the respective semiconductor light emitting modules can implement different colors. Using this method, it is not necessary to transfer different types of semiconductor light emitting devices to one substrate, which leads to a reduced transfer time.

In some implementations, the lamp enables a user to light or flicker only some of the light emitting regions. For example, the region in which the semiconductor light emitting device emits light is clearly distinguished from the region in which the semiconductor light emitting device does not emit light. To this end, the lamp includes partition walls formed between the semiconductor light emitting devices and passing through the vertically-stacked semiconductor light emitting modules.

Figure 7:
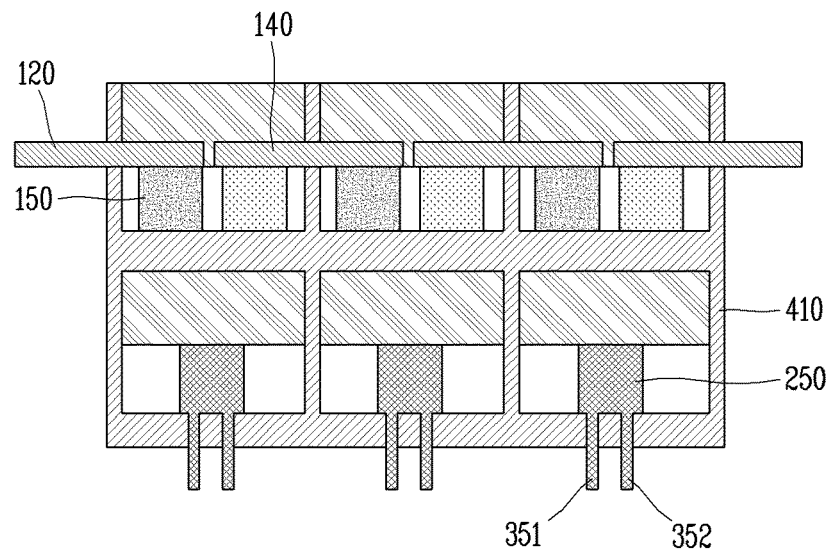
FIGS. 7 and 8 are concept views showing example partition walls that pass through example semiconductor light emitting modules.
Figure 8:
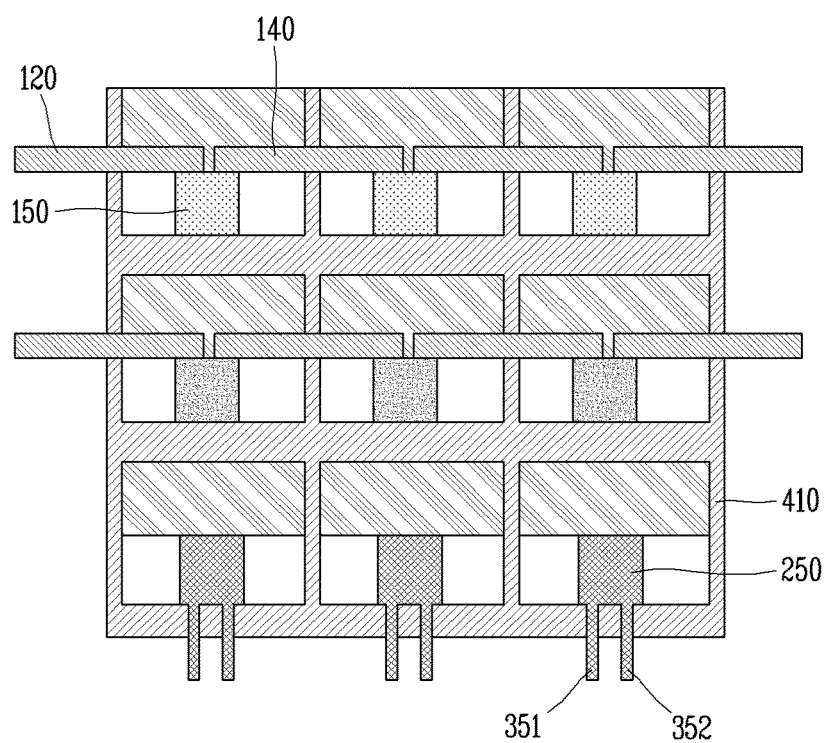
Figure 9:
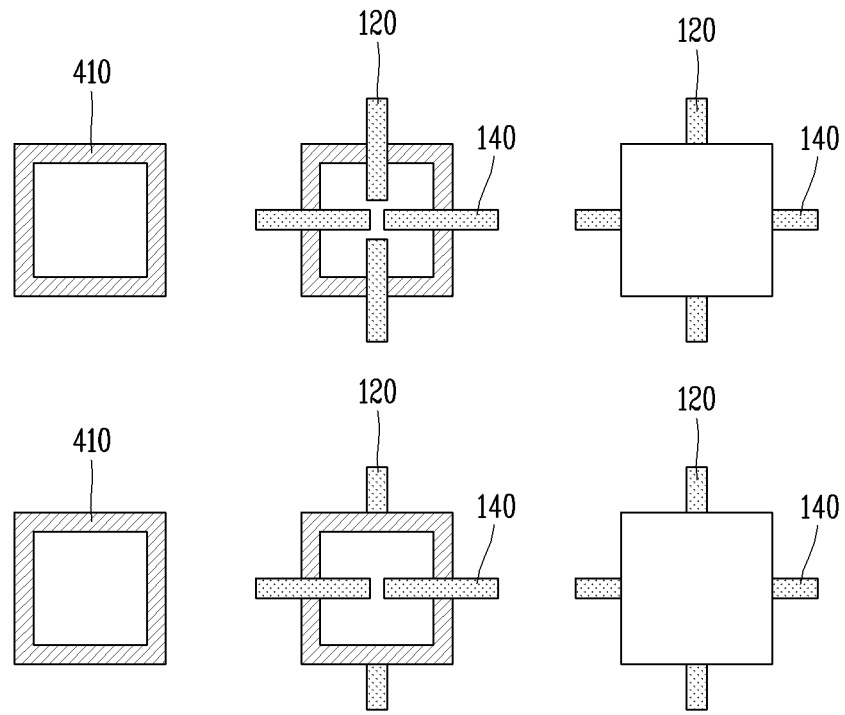
FIG. 9 is a concept view showing an example arrangement of partition walls and electrode lines of an example lamp.

FIGS. 7 and 8 are concept views showing example partition walls passing through the semiconductor light emitting modules, and FIG. 9 is a concept view showing an example arrangement of the partition walls and example electrode lines provided in the lamp.

At least one of the semiconductor light emitting devices provided in each of the light emitting modules may be disposed between any one of the partition walls and another partition wall facing that partition wall.

Referring to FIG. 7, the lamp may include a first semiconductor light emitting module having two types of semiconductor light emitting devices and a second semiconductor light emitting module having one type of semiconductor light emitting device. In this case, one or two semiconductor light emitting devices are disposed between the two facing partition walls. The partition walls 410 are disposed to pass through the first and second semiconductor light emitting modules.

In one implementation, any one of the two light emitting modules shown in FIG. 7 may have a semiconductor light emitting device that emits red light and the other may have semiconductor light emitting devices that emit green and blue light. Here, the semiconductor light emitting device emitting red light may be disposed on the bottommost layer of the lamp. It is because the semiconductor light emitting device that emits the red light is the most heat-sensitive one among the semiconductor light emitting devices that emit red, green, and blue light. Accordingly, the second semiconductor light emitting module may include a semiconductor light emitting device that emits red light, and the first semiconductor light emitting module may include semiconductor light emitting devices that emit green and blue light.

In some implementations, as shown in FIG. 8, the lamp may have a structure in which one second semiconductor light emitting module and two first semiconductor light emitting modules are stacked in order. In this case, one semiconductor light emitting device is disposed between the two facing partition walls. Here, the partition walls 410 are disposed to pass through the three semiconductor light emitting modules.

In one implementation, each of the three semiconductor light emitting modules shown in FIG. 8 may have a semiconductor light emitting device that emits any one of red, green, and blue light. Here, the semiconductor light emitting device that emits the red light may be disposed on the bottommost layer. As a result, the second semiconductor light emitting module may include the semiconductor light emitting device that emits the red light.

The partition walls 410 may be made of a material with high reflectivity, such as $TiO_2$ and $Al_2O_3$ or may be a polymer structure coated with a metal thin film. Since the partition walls 410 are disposed to surround the respective sides of the semiconductor light emitting devices and pass through the semiconductor light emitting modules in a thickness direction, the electrode lines inevitably overlap with the partition walls.

As explained with reference to FIG. 6, the electrode lines provided in the second semiconductor light emitting module are formed on the lower side of the semiconductor light emitting device, passing through the substrate, so that the electrode lines and the partition walls may not overlap with each other.

Each of the partition walls may have holes through which the electrode lines pass that are provided in the light emitting modules, except the second light emitting module stacked on the bottommost layer of the lamp. Referring to FIG. 9, the first electrode line 120 and the second electrode line 140 provided in each semiconductor light emitting module may be arranged on the same plane. This arrangement may be useful when the semiconductor light emitting device provided in the semiconductor light emitting module is a flip chip type light emitting device. Here, the hole through which the first electrode line 120 passes and the hole through which the second electrode line 140 passes may be arranged on the same plane.

In some examples, when the semiconductor light emitting device provided in the semiconductor light emitting module is a vertical type light emitting device, the first electrode line 120 and the second electrode line 140 may be formed on different planes. Here, the hole through which the first electrode line 120 passes and the hole through which the second electrode line 140 passes may be arranged on the different planes.

Furthermore, the partition walls can be manufactured during the manufacture of the semiconductor light emitting module.

Figure 10:
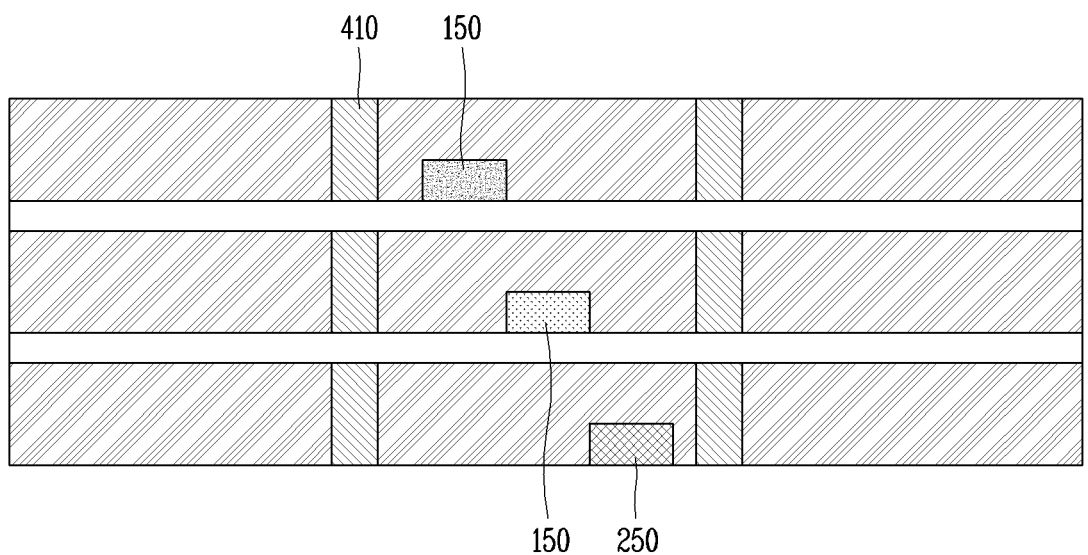
FIGS. 10 to 12 are concept views showing partition walls provided in each semiconductor light emitting module.
Figure 11:
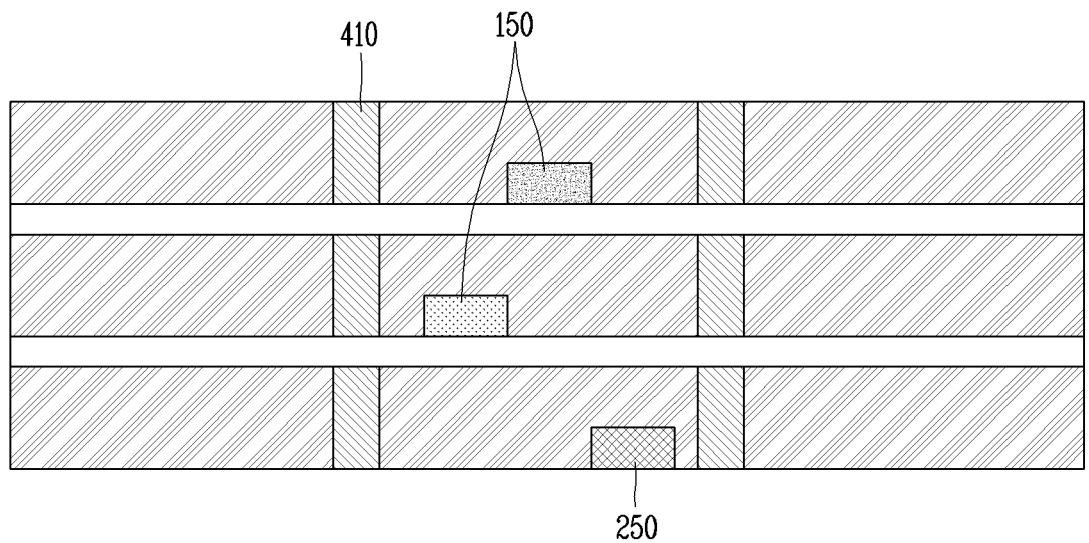
Figure 12:
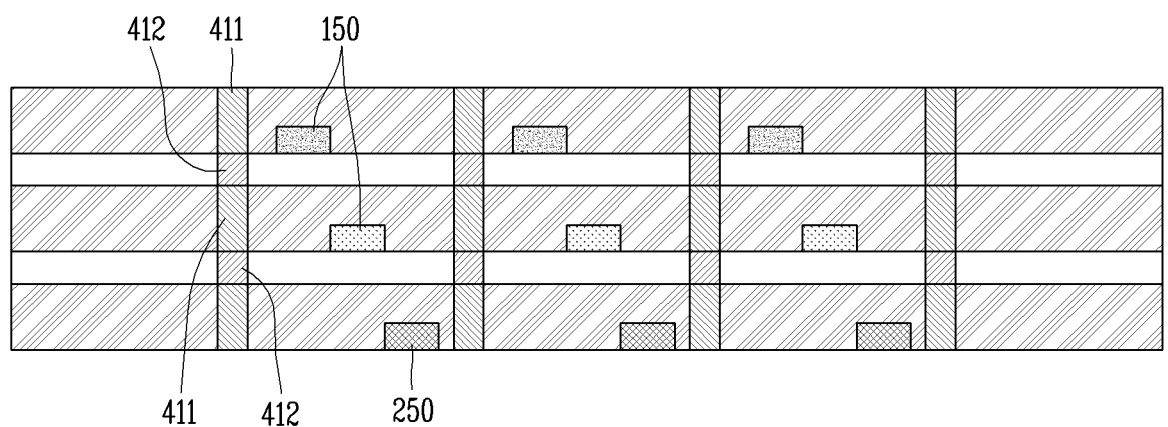

FIGS. 10 to 12 are concept views showing example partition walls disposed in each of the semiconductor light emitting modules.

FIGS. 10 to 12 are sectional concept views showing the lamp. Although FIGS. 10 and 11 show only the semiconductor light emitting devices and partition walls, the lamp may include the components explained with reference to FIG. 6.

In some implementations, the semiconductor light emitting device provided in each of the semiconductor light emitting modules may be formed without overlapping with each other. This can maximize an intensity of light of the lamp. In some examples, the semiconductor light emitting devices included in the light emitting modules may be offset from each other in a width direction transverse to the thickness direction. For example, as shown in FIG. 10, the semiconductor light emitting devices provided in each of the semiconductor light emitting modules may be arranged in a stair manner. In another example, as shown in FIG. 11, the semiconductor light emitting devices provided in each of the semiconductor light emitting modules may be arranged in a random manner.

In some examples, as shown in FIG. 10, when the partition wall is manufactured during the manufacture of the semiconductor light emitting module, the partition wall may not be formed between the semiconductor light emitting modules. For example, when the semiconductor light emitting module is stacked, a transparent adhesive layer may be disposed between the semiconductor light emitting modules. In this case, no partition wall is formed on the transparent adhesive layer, and light leakage to the transparent adhesive layer may occur.

In some implementations, each of the partition walls may have a first partition wall part passing through each of the semiconductor light emitting modules and a second partition wall part formed between the semiconductor light emitting modules.

For example, referring to FIG. 12, the partition wall may include a first partition wall part 411 and a second partition wall part 412. The first partition wall part 411 may be manufactured during the manufacture of the semiconductor light emitting module. On the other hand, the second partition wall part 412 may be formed during the attachment of the two semiconductor light emitting modules.

For example, the second partition wall part 412 may be formed in a mesh type. When the mesh-type second partition wall part is disposed on the upper side of the semiconductor light emitting module and an adhesive material is applied thereto, the adhesive material is disposed between the second partition wall parts. Here, the second partition wall part should be disposed to overlap with the first partition wall part. Then, the aforementioned semiconductor light emitting module and another semiconductor light emitting module are stacked, so that the two semiconductor light emitting modules are attached and at the same time the second partition wall part is formed.

As described above, in the process of attaching the two semiconductor light emitting modules, the second partition wall part may serve as a mold for the adhesive material.

The second partition wall part may be made of a metal material or a material with high reflectivity, such as $TiO_2$ and $Al_2O_3$. However, the present disclosure is not limited thereto, and the second partition wall part may be made of all types of materials with a certain degree of reflexivity.

As described above, when the partition wall part is disposed between the semiconductor light emitting devices, it is not only possible to light or flicker only a portion of the lamp but also implement various colors in the single lamp.

In one implementation, a voltage may be selectively applied to at least one of the semiconductor light emitting devices disposed between any one of the partition walls and another partition wall facing that partition wall, so that the semiconductor light emitting device can selectively emit light. As such, it is possible to light or flicker only some of the light emitting regions of the lamp. In addition, selectively applying a voltage to the semiconductor light emitting device that emits a specific color of light enables the lamp to emit that specific color of light.

In some implementations, light beams emitted from the lamp may be irradiated in different colors according to their colors.

Figure 13:
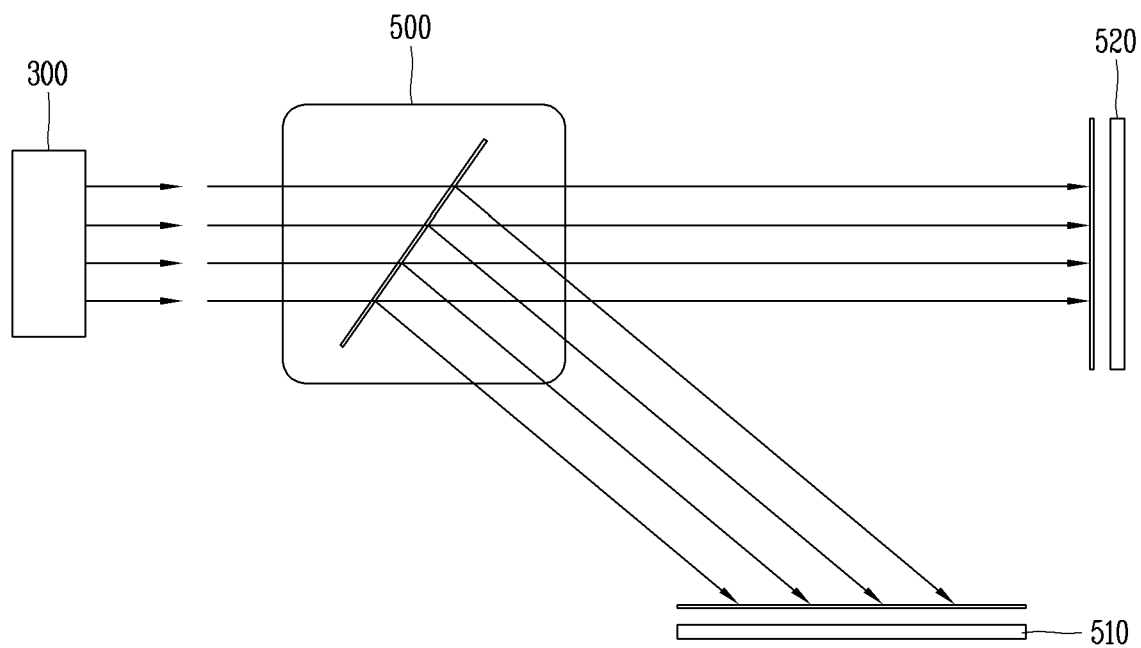
FIG. 13 is a concept view showing an example polarized beam splitter and an example optical filter of an example lamp.

FIG. 13 is a concept view showing an example polarized beam splitter and an example optical filter provided in the lamp.

The lamp disposed in the vehicle can perform two major functions.

In some implementations, the vehicle lamp may irradiate a certain intensity of light to the front of the vehicle to secure the view of the driver. When the lamp performs this function, the color of the irradiated light is limited so as not to interfere with the view of other drivers. For example, light irradiated to secure the view of the driver is limited to white light. Light other than the white light should not be irradiated to the front of the vehicle.

In the same or other implementations, the vehicle lamp may serve to communicate with pedestrians or other drivers. For example, it is possible to communicate with pedestrians or other drivers by irradiating certain signals to a road surface around the vehicle. For example, when a pedestrian tries to cross a road which is not a crosswalk, a crosswalk-shaped signal may be irradiated to the road surface to inform that the pedestrian may cross the road. Light other than the white light may be used for the aforementioned communication.

As shown in FIG. 13, in order for the single lamp to perform the above two functions, the polarized beam splitter and optical filter layer 500 may be disposed at the front of the lamp. For example, the polarized beam splitter separates some of the light beams emitted from the light emitting modules to change their proceeding directions. In some implementations, the optical filter layer blocks a certain wavelength of light. This prevents light other than white light from being irradiated to the front of the vehicle. In addition, this allows a certain wavelength of light to be irradiated around the vehicle.

When the polarized beam splitter and optical filter layer 500 are combined, it can separate some of the light beams emitted from the lamp and irradiate them in a certain direction. According to the present disclosure, it is thus possible to irradiate light to a road surface 510 around the vehicle and at the same time to irradiate a certain intensity of white light to the front 520 of the vehicle. Here, in order to adjust the position of the road surface to which light is irradiated, the polarized beam splitter may be rotatable.

In some examples, in order to facilitate the above light splitting, light incident on the polarized beam splitter and optical filter layer 500 should be parallel. Thus, the present disclosure proposes a structure configured such that parallel light is incident on the polarized beam splitter and optical filter layer.

Figure 14:
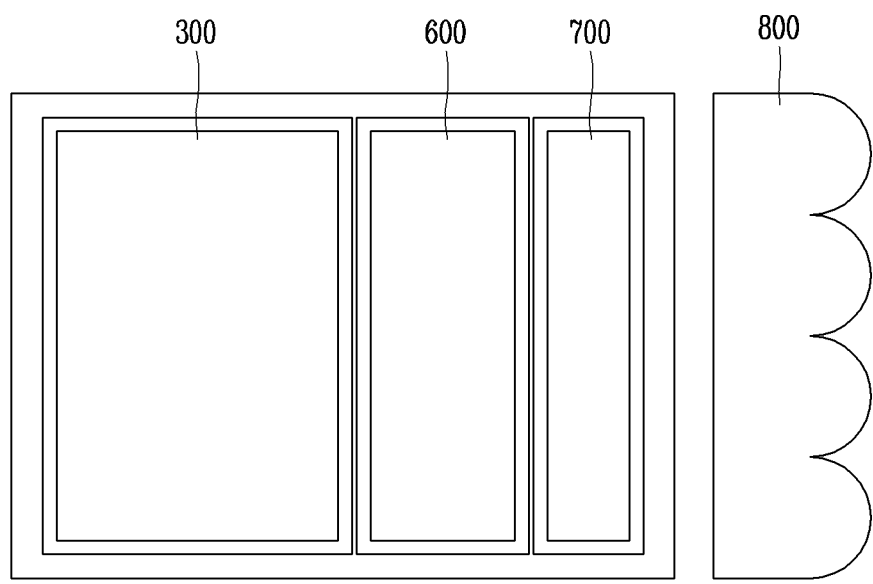
FIG. 14 is a concept view showing an example lamp that includes an example light mixing layer and an example microlens array.

FIG. 14 is a concept view showing a lamp having a light mixing layer and a microlens array.

As shown in FIG. 14, the light emitting region of the lamp 300 may overlap with the light mixing layer 600 and the microlens array 700. For example, the light mixing layer 600 may increase an optical path to mix light beams emitted from different semiconductor light emitting modules. In some examples, the light mixing layer 600 may decrease the optical path or change a direction of the optical path to mix light beams emitted from different semiconductor light emitting modules. In some implementations, the microlens array 700 may allow light passing through the light mixing layer 600 to be parallel light. The above-described light mixing layer 600 and microlens array 700 allow parallel light to be incident on the polarized beam splitter and optical filter layer.

The vehicle lamp described above can selectively light and flicker some of the light emitting regions or selectively output a certain color of light. That is, the lamp can control lighting and flickering in pixel units or adjust the colors of the pixels.

In some implementations, the lamp allows light beams emitted from the single light emitting region to be irradiated to different regions. As such, the lamp can be used to secure the view of the driver and to communicate with pedestrians or other drivers.

In order to secure the view of the driver, a certain intensity of light should be irradiated to the front of the vehicle. While light is irradiated to the front of the vehicle to secure the view of the driver, if the lamp is used as a communication means, the intensity of the light for securing the view of the driver may be instantaneously reduced. The present disclosure proposes a controlling method as follows.

For example, the controlling method of the present disclosure includes: applying a voltage to each of the semiconductor light emitting devices included in each of the pixels to emit light, so that white light can be emitted from the lamp; receiving an information display request on the road surface from the user; interrupting the voltage applied to at least some of the semiconductor light emitting devices included in some of the pixels, so that light having a different color than the white light can be output from some of the pixels, upon the receipt of the information display request; and increasing the amplitude of the voltage applied to the semiconductor light emitting devices whose voltage has not been interrupted, among the semiconductor light emitting devices included in some of the pixels, so that the intensity of light of some of the pixels can increase, when the voltage applied to at least some of the semiconductor light emitting devices is interrupted.

Only some of the whole pixels included in the lamp should be lit to display information on the road surface around the vehicle. In some examples, upon the receipt of the information display request, the present method interrupts the voltage to the semiconductor light emitting devices provided in some of the pixels.

Accordingly, the intensity of light for securing the view of the driver may be reduced. In some implementations, the present method may increase the amplitude of the voltage applied to the semiconductor light emitting devices whose voltage is not interrupted by the information display request, thereby increasing the brightness of the semiconductor light emitting devices. As such, the present disclosure can compensate for an optical loss caused by the information display.

It will be apparent to those skilled in the art that the present disclosure may be embodied in other specific forms without departing from the spirit or essential characteristics thereof.

In addition, the foregoing detailed description should not be construed in any way as limiting but be intended to be illustrative. The scope of the present disclosure should be determined by the rational interpretation of the appended claims, and all changes within the scope of the equivalents of the present disclosure are included in the scope of the present disclosure.

What is claimed is:

1. A vehicle lamp, comprising:
a plurality of light emitting modules that are vertically stacked with each other in a thickness direction, each of the light emitting modules comprising a substrate and a plurality of semiconductor light emitting devices located on the substrate; and
partition walls located between the semiconductor light emitting devices, the partition walls passing through each of the light emitting modules in the thickness direction,
wherein the semiconductor light emitting devices provided in different light emitting modules among the light emitting modules are configured to emit light having different wavelengths, and
wherein each of the partition walls includes a first partition wall part that passes through the light emitting modules and a second partition wall part located between the light emitting modules.

2. The vehicle lamp of claim 1, further comprising a first electrode line and a second electrode line that are electrically connected to each of the plurality of semiconductor light emitting devices,
wherein each of the light emitting modules includes a first electrode configured to connect to the first electrode line and a second electrode configured to connect to the second electrode line.

3. The vehicle lamp of claim 2, wherein the partition walls define holes that allow the first and second electrode lines to pass and that are located at at least one of the plurality of light emitting modules except for a bottommost light emitting module among the plurality of light emitting modules.

4. The vehicle lamp of claim 2, wherein a bottommost light emitting module among the plurality of light emitting modules includes portions of the first and second electrode lines that are located vertically below the semiconductor light emitting device of the bottommost light emitting module, and
wherein the portions of the first and second electrode lines pass through the substrate of the bottommost light emitting module.

5. The vehicle lamp of claim 1, wherein each of the light emitting modules includes at least one of the semiconductor light emitting devices located between a first partition wall and a second partition wall among the partition walls, the second partition wall facing the first partition wall.

6. The vehicle lamp of claim 5, wherein the light emitting modules comprise a first light emitting module and a second light emitting module stacked on the first light emitting module.

7. The vehicle lamp of claim 6, wherein one of the first light emitting module or the second light emitting module includes a semiconductor light emitting device configured to emit red light, and
wherein the other of the first light emitting module or the second light emitting module includes a semiconductor light emitting device configured to emit green light and a semiconductor light emitting device configured to emit blue light.

8. The vehicle lamp of claim 5, wherein the semiconductor light emitting devices provided in any one of the light emitting modules are configured to emit light having a same wavelength.

9. The vehicle lamp of claim 8, wherein the light emitting modules comprises three light emitting modules stacked with each other, and
wherein each of the three light emitting modules includes a semiconductor light emitting device configured to emit any one of red, green, or blue light.

10. The vehicle lamp of claim 9, wherein the semiconductor light emitting device configured to emit red light is disposed on a bottommost light emitting module among the three light emitting modules.

11. The vehicle lamp of claim 1, wherein the semiconductor light emitting devices included in the light emitting modules are offset from each other in a width direction transverse to the thickness direction.

12. The vehicle lamp of claim 1, further comprising a transparent adhesive layer disposed between the light emitting modules,
wherein the transparent adhesive layer is disposed between second partition wall parts.

13. The vehicle lamp of claim 1, wherein the first partition wall part overlaps with the second partition wall part.

14. The vehicle lamp of claim 1, wherein the second partition wall part is a mesh-type partition wall part.

15. The vehicle lamp of claim 1, wherein the light emitting modules include at least one of the semiconductor light emitting devices that is disposed between a first partition wall and a second partition wall among the partition walls, the second partition wall facing the first partition wall, and
wherein the at least one of the semiconductor light emitting devices is configured to selectively emit light based on a voltage applied to the at least one of the semiconductor light emitting devices.

16. The vehicle lamp of claim 1, further comprising a polarized beam splitter that is located in a path of light emitted from the light emitting modules, that is configured to separate at least a portion of light beams emitted from the light emitting modules, and that is configured to change proceeding directions of at least the portion of light beams.

17. The vehicle lamp of claim 16, wherein the polarized beam splitter is configured to rotate relative to the light emitting modules.

18. The vehicle lamp of claim 16, further comprising an optical filter layer that overlaps with the polarized beam splitter and that is configured to restrict transmission of light having a predetermined wavelength.

19. The vehicle lamp of claim 1, further comprising a light mixing layer that is located in a path of light emitted from the light emitting modules and configured to change optical paths of light beams emitted from the light emitting modules.

* * * * *